US008734662B2

United States Patent
Hsu et al.

(10) Patent No.: US 8,734,662 B2
(45) Date of Patent: May 27, 2014

(54) TECHNIQUES PROVIDING PHOTORESIST REMOVAL

(75) Inventors: Yu-Rung Hsu, Tainan (TW); Sung Hsun Wu, Kaohsiung (TW); Kuo Bin Huang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 33 days.

(21) Appl. No.: 13/311,948

(22) Filed: Dec. 6, 2011

(65) Prior Publication Data

US 2013/0143406 A1 Jun. 6, 2013

(51) Int. Cl.
 *B44C 1/22* (2006.01)
(52) U.S. Cl.
 USPC .......... 216/57; 216/67; 216/83; 216/87; 438/689; 438/704; 438/706; 438/710; 438/745; 134/1; 134/1.3
(58) Field of Classification Search
 None
 See application file for complete search history.

(56) References Cited

U.S. PATENT DOCUMENTS

| 2007/0054492 A1* | 3/2007 | Elliott et al. ............... 438/689 |
| 2007/0251551 A1* | 11/2007 | Korzenski et al. ........... 134/41 |
| 2008/0013946 A1* | 1/2008 | Ono et al. ................... 396/578 |
| 2010/0071718 A1* | 3/2010 | Le et al. ..................... 134/1 |
| 2010/0304554 A1* | 12/2010 | Hidaka et al. .............. 438/514 |

OTHER PUBLICATIONS

D. Tsvetanova et al., "Non-Oxidizing Solvent-Based Strip of Ion Implanted Photoresist," p. 74-75.
Koichi Kajihara et al., "Formation and Decay of Nonbridging Oxygen Hole Centers in $SiO_2$ Glasses Induced by $F_2$ Laser Irradiation: In Situ Observation Using a Pump and Probe Technique," Applied Physics Letters, vol. 79, No. 12, Sep. 17, 2001, pp. 1757-1759.

* cited by examiner

*Primary Examiner* — Lan Vinh
*Assistant Examiner* — Jiong-Ping Lu
(74) *Attorney, Agent, or Firm* — Hayes and Boone, LLP

(57) ABSTRACT

A method for manufacturing a semiconductor device includes forming a patterned photoresist layer over a substrate, performing a plasma ashing process to the patterned photoresist layer, thereby removing a portion of the patterned photoresist layer, exposing the patterned photoresist layer to broadband ultraviolet radiation and ozone, thereby removing other portions of the patterned photoresist layer, and performing a cleaning of the patterned photoresist layer after exposing the patterned photoresist layer to broadband ultraviolet radiation and ozone.

14 Claims, 8 Drawing Sheets

| Bonding Type | Bonding Energy eV | Oxidization by Ozone |
|---|---|---|
| C3C | 8.70 | Group A |
| C=C | 6.36 | Group A |
| H-F | 5.89 | Group A |
| Si-F | 5.86 | Group A |
| O=O | 5.12 | Group A |
| C-F | 5.06 | Group A |
| O-H | 4.76 | Group A |
| Si-H | 4.07 | Group B |
| O-H | 3.79 | Group B |
| C-O | 3.73 | Group B |
| Si-C | 3.73 | Group B |
| Si-N | 3.68 | Group B |
| C-C | 3.61 | Group B |
| C-N | 3.19 | Group B |
| N-O | 2.08 | Group C |
| C=O | 1.94 | Group C |
| F-F | 1.64 | Group C |
| O-O | 1.50 | Group C |

FIG. 4

TECHNIQUES PROVIDING PHOTORESIST REMOVAL

BACKGROUND

In one example conventional process a photoresist is applied on a substrate and patterned so that some areas of the substrate are exposed. The exposed areas are then implanted with dopants. However, the implantation process may chemically change an outer portion of the photoresist layer so that the outer portion includes tough polymers with single carbon bonds. The chemically changed outer portion of the photoresist layer may make the photoresist layer more difficult to remove using conventional techniques.

One conventional technique includes the use of a plasma ashing process and a wet clean to remove the photoresist. The plasma ashing process creates an ash residue from the photoresist, and the wet clean process removes the residue and any remaining photoresist material. However, the ash residue can be difficult to remove completely with the wet clean, especially in scenarios when the photoresist has been subjected to an implantation process. In some cases, the residue may remain on the substrate after the stripping process is completed, which interferes with formation of subsequent layers and lowers yield. On the other hand, the times/concentrations for the plasma ashing and wet clean can be increased to ensure that more photoresist residue is removed, but such an approach may lead to broken lines on the semiconductor devices. Thus, residue removal and broken lines can sometimes be a trade-off in conventional processes. What is needed is an improved technique to remove photoresist material.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a table showing different types of chemical bonds that may be broken down with an ozone and ultraviolet treatment, according to one embodiment.

SUMMARY

Figure 1:
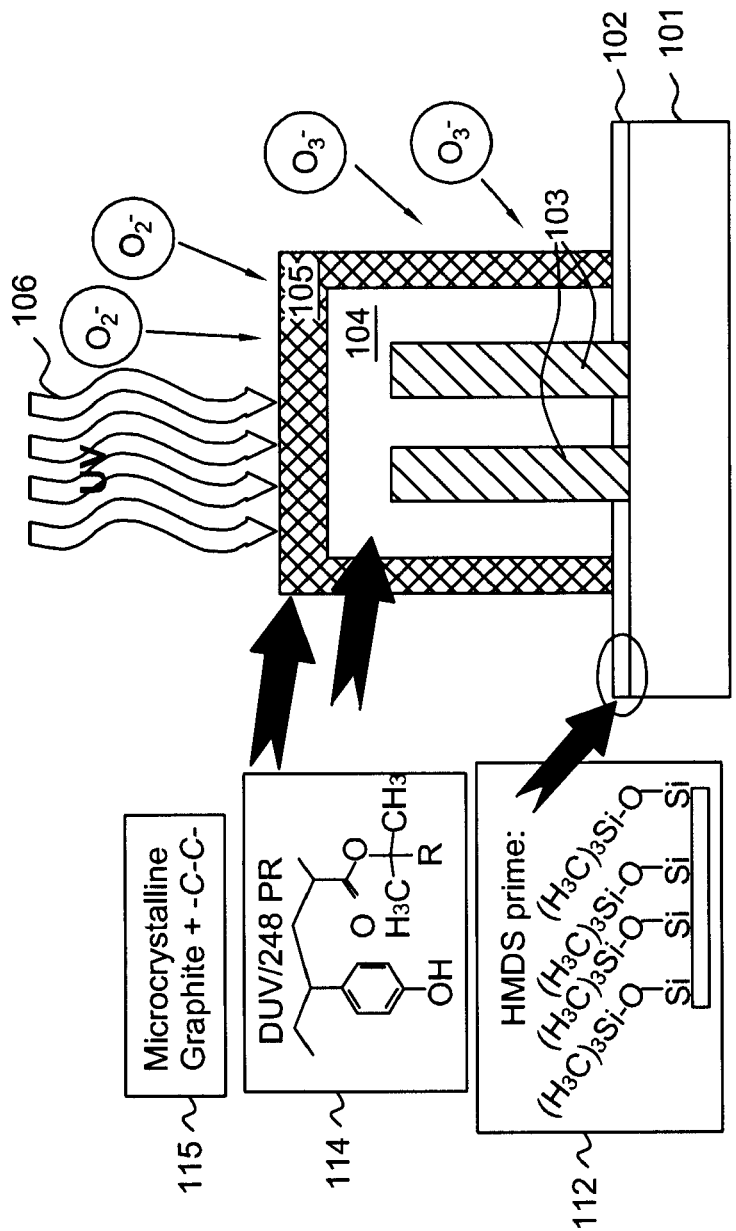
FIG. 1 is an illustration of an exemplary ozone an ultraviolet treatment being applied to a structure built upon a semiconductor substrate, according to one embodiment.

One of the broader forms of the present disclosure involves a method for manufacturing a semiconductor device includes forming a patterned photoresist layer over a substrate, performing a plasma ashing process to the patterned photoresist layer, thereby removing a portion of the patterned photoresist layer, exposing the patterned photoresist layer to broadband ultraviolet radiation and ozone, thereby removing other portions of the patterned photoresist layer, and performing a cleaning of the patterned photoresist layer after exposing the patterned photoresist layer to broadband ultraviolet radiation and ozone.

Another one of the broader forms of the present disclosure involves a method of manufacturing a semiconductor device includes forming a patterned photoresist layer on a semiconductor substrate, removing at least a portion of the patterned photoresist layer by plasma ashing, the plasma ashing creating a photoresist plasma residue on the substrate, after the plasma ashing, exposing the photoresist plasma residue to ultraviolet radiation and ozone, and performing a cleaning on the photoresist plasma residue after the exposing.

Still another one of the broader forms of the present disclosure involves a semiconductor fabrication machine including a first module that includes a chamber configured to expose a semiconductor wafer to ozone and ultraviolet radiation, and a second module integrated with the first module, the second module configured either to deliver the semiconductor wafer to the first module or to receive the semiconductor wafer from the first module, the second module further configured to perform one or more processing steps upon the semiconductor wafer.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact Various embodiments include methods for manufacturing a semiconductor device. In one example, a method provides for an ultraviolet/ozone treatment that can be performed before or after a plasma ashing process for removing photoresist material. Further in the example, the embodiment includes forming and patterning the photoresist material on a semiconductor substrate. For instance, the photoresist material may be patterned so as to expose areas of the substrate that will be used as sources and drains. An implantation process is then performed, which causes chemical changes in some parts of the photoresist material.

After implantation, when it is desired to remove the photoresist material, an ultraviolet and ozone treatment is performed, which helps to break down, and least partially remove, the photoresist material. In some scenarios, the implantation process creates polymers on the outside surface of the photoresist material where the polymers make the photoresist material more difficult to break down and remove. The ultraviolet and ozone treatment converts some single carbon bonds in the photoresist material to double carbon bonds, which are more easily broken. The double carbon bonds are then broken to create smaller polymer chains, where some of the polymer molecules are oxidized to form $CO_2$ and $H_2O$.

The process continues by performing a plasma ashing process after completion of the ultraviolet and ozone treatment. For instance, the plasma ashing may include an oxygen plasma or other plasma that removes photoresist material. Plasma ashing of photoresist material in this embodiment leaves photoresist ash residue and hexamethyldisilazane (HMDS).

The plasma ashing step may be followed by another ultraviolet and ozone treatment. The second ultraviolet and ozone treatment may be the same as, or similar to, the first ultraviolet and ozone treatment, and it chemically breaks down any remaining photoresist material or ash residue on the substrate.

The second ultraviolet and ozone treatment may be followed by a wet clean to remove the chemically broken down material that may remain on the substrate. An example of a wet clean includes a high-temperature sulfuric acid and peroxide cleaning process. However, other embodiments may use any other suitable wet clean process. Further processing steps may include depositing and patterning a variety of layers on the substrate to create devices, such as transistors and the like.

The example embodiment described above includes two ultraviolet and ozone treatments—one before and one after the plasma ashing. However, other embodiments may omit one of the ultraviolet and ozone treatments. For instance, one embodiment includes omitting the first ultraviolet and ozone treatment, so that the treatment is applied only after the plasma ashing.

Some embodiments use a broadband ultraviolet during the ultraviolet and ozone treatments. As used in this example, broadband ultraviolet includes a plurality of different ultraviolet emissions across a spectrum from 200 nm to 1600 nm. One specific example includes at least one ultraviolet emission in the range of 200 nm to 280 nm, at least one emission in the range of 280 nm to 320 nm, and at least one emission in the range of 320 nm to 1600 nm. The use of a broadband ultraviolet may provide some amount of flexibility to the process, allowing the process to remove any of a variety of different photomasks that might not all be removable using only a narrowband ultraviolet emission. Broadband emissions may be achieved in some embodiments by using a variety of different sources (e.g., bulbs) that each emit ultraviolet radiation in at least one band. Bulbs in different bands may be selected to provide emissions across a large spectrum.

Another embodiment includes a fabrication machine for performing the above-described processes. Such an embodiment may include an ultraviolet/ozone chamber that performs the ultraviolet and ozone treatments. The ultraviolet/ozone chamber may be integral to, or operably connected with, another fabrication tool to pass wafers to, or receive wafers from, the ultraviolet/ozone chamber.

In one example, the fabrication machine includes an ultraviolet/ozone chamber with a wet clean tool. Another example includes an ultraviolet/ozone chamber with a plasma ashing tool. However, other embodiments may associate an ultraviolet/ozone chamber with any suitable tool, such as a track unit, for use in semiconductor fabrication.

FIG. 1 is an illustration of a portion of an exemplary feature built upon semiconductor substrate 101 adapted according to one embodiment. In FIG. 1, an ultraviolet and ozone treatment is applied to a photoresist layer before a plasma ashing process is applied.

HMDS 102 is applied to the substrate 101 to promote adherence of photoresist 104. Block 112 shows a chemical structure of HMDS. Then a photoresist layer 104 is applied to substrate 101 and patterned to have the shape shown in FIG. 1. In this particular example, photoresist 104 is applied to protect polysilicon structure 103 during other processing steps that might damage or alter structure 103, such as etching, implantation, and the like.

In this example, the photoresist includes deep ultraviolet (DUV) photoresist, such as a photoresist for 248 nm exposure by a Krypton Fluoride (KrF) Excimer Laser. The scope of embodiments is not so limited, any suitable photoresist material may be used in some embodiments. Block 114 shows a chemical structure of example photoresist 104.

During an example implantation process, photoresist 104 may be changed chemically due the chemicals and heat to which it is exposed. As such, in this example, the outside surface 105 of photoresist 104 has been changed, as shown in block 115. Some of the polymers shown in block 114 have been chemically changed to microcrystalline graphite and long, single carbon chains. The long, single carbon chains of outside portion 105 may be somewhat resistant to plasma ashing and may further lead to increased residue after the plasma ashing process.

The photoresist 104 is subjected to ultraviolet radiation 106 and ozone in order to break carbon chains in the outer surface 105 so that photoresist 104 is more easily removed in subsequent steps. Example ultraviolet radiation 106 and ozone treatment steps are described in more detail with respect to FIGS. 2 through 5.

It is noted that FIG. 1 shows O2 molecules in the process in addition to ozone (O3) molecules. In some embodiments, the ozone is made with an ozone generator, and there is very little or no O2 in the process. In another embodiment, an O2/noble gas mixture (such as Ar/O2 at 20-50% O2 or He/O2 at 20-50%) is injected into the chamber, and the ultraviolet radiation 106 converts some or all of the O2 to ozone. In either scenario, the ozone is available for reaction with photoresist 104 and surface 105. In embodiments that convert O2 to ozone, shorter ultraviolet wavelengths and higher intensities may be applied than are applied in embodiments that inject ozone into the chamber.

Figure 2:
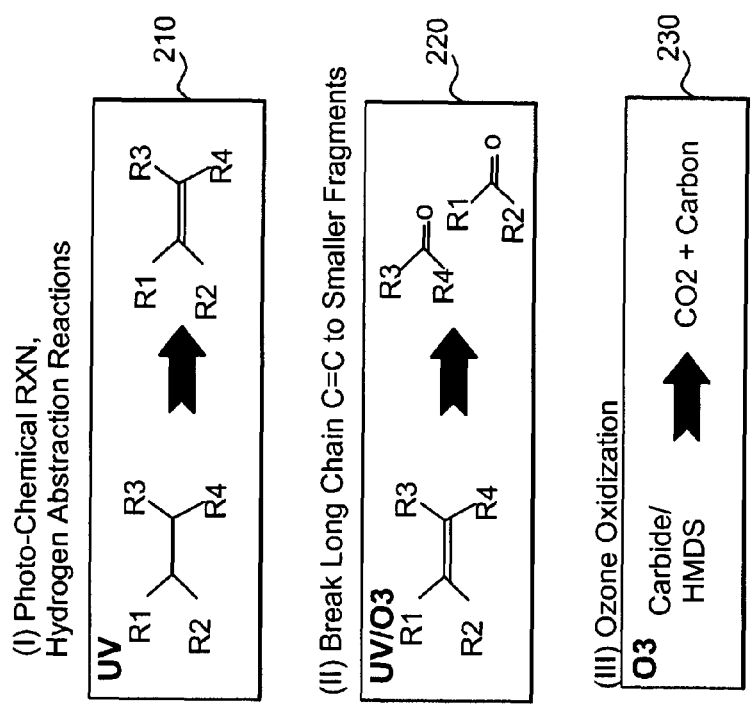
FIG. 2 is an illustration of chemical changes in a photoresist material or photoresist residue during an ozone and ultraviolet treatment, according to one embodiment.

FIG. 2 is an illustration of the chemical reactions occurring during the process illustrated in FIG. 1. In block 210, a photochemical reaction takes place that changes some of the single carbon bonds into double carbon bonds. In block 220, the ultraviolet radiation and the ozone break longer chains with double carbon bonds into smaller fragments that have an oxygen component. In block 230, carbide molecules and HMDS are converted to CO2 and carbon through oxidation. The chemical changes shown in FIG. 2 make photoresist 104 and surface 105 more susceptible to ashing and removal.

Figure 3:
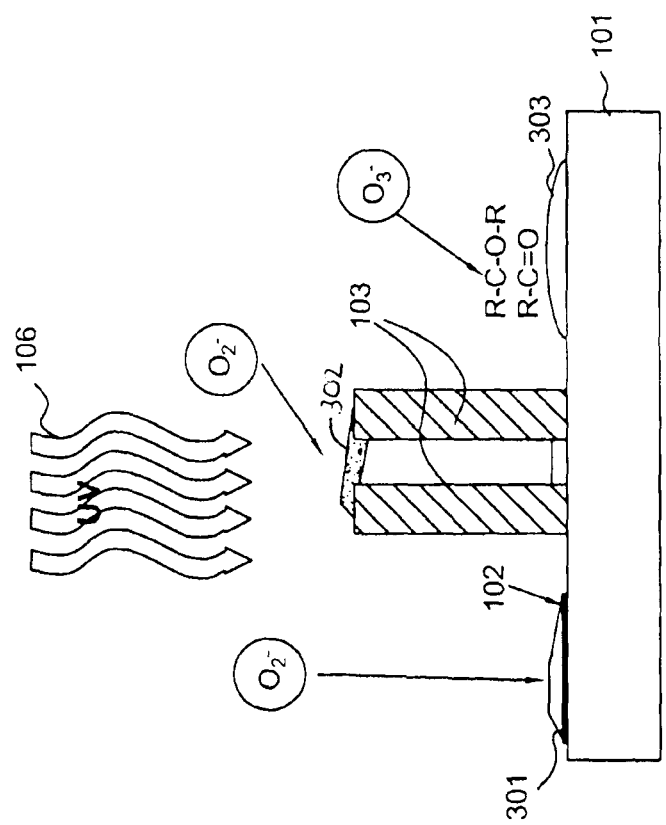
FIG. 3 is an illustration of an exemplary ozone an ultraviolet treatment being applied to a structure built upon a semiconductor substrate, according to one embodiment.

FIG. 3 is an illustration of a portion of an exemplary feature built upon semiconductor substrate 101 adapted according to one embodiment. In FIG. 3, an ultraviolet and ozone treatment is applied to a photoresist layer after a plasma ashing process is applied. FIG. 3 shows an ultraviolet radiation and ozone treatment breaking down residue from the plasma ashing process.

In FIG. 3, the plasma ashing process has reduced the photoresist and the HMDS to the remaining residue shown. Residue 301 includes SiCO, and a portion of HMDS remains underneath residue 301. Residue 302 includes ashed photoresist with various silicon and carbon compounds. Residue 303 includes carbon and oxygen compounds, some with single carbon bonds and others with double carbon bonds.

The ultraviolet radiation and ozone treatment of FIG. 3 further breaks down the molecules of residue 301-303, as shown in FIG. 2. In other words, some carbon chains are broken into smaller fragments, some single carbon bonds are changed to double carbon bonds, and some carbides and HMDS is changed to CO2 and carbon. Furthermore, silicon-organic and polysilicon-organic bonds may be broken down as well. Just as in FIG. 1, the chemical processes of FIG. 3 make the residue 301-303 easier to remove. Further, as in FIG. 1, some embodiments may inject O2 and create ozone from the O2, whereas other embodiments may inject ozone.

FIG. 4 is an illustration of various types of bonds and how they may be grouped according to one or more embodiments. A first column shows bonding type, and the middle column shows bonding energies associated with each of the different types of chemical bonds in the first column. The bonding type shown in the first column are found in currently available photoresist materials, as well as in the silicon-organic and polysilicon-organic bonds formed at a Si/photoresist or poly/photoresist interface. The third column groups the different chemical bonds by ultraviolet wavelength used to break the bonds.

The top two chemical bonds, C3C and C=C can be broken by ozone oxidation rather than directly by ultraviolet energy. The chemical bonds in Group A can be broken using wavelengths between 200 and 300 nanometers. The bonds in Group B can be broken using ultraviolet wavelengths in the range of 300 to 400 nanometers. Similarly, the bonds in Group C can be broken using ultraviolet wavelengths of 400 nanometers and above.

While a particular wafer with a particular photoresist layer may include only a few of the chemical bonds in FIG. 4, a more robust system capable of handling a wider variety of photoresists is provided by one embodiment. Specifically, such embodiment is capable of breaking down most or all of the bonds shown in FIG. 4 and accordingly uses broadband ultraviolet radiation that corresponds to each groups A, B, and C.

Such embodiment may be used for any of a variety of different types of photoresist materials at different stages of wafer fabrication. An embodiment that is capable of breaking down each of the bonds in FIG. 4 may be applied to any currently-available photoresist with organic bonds.

Figure 5:
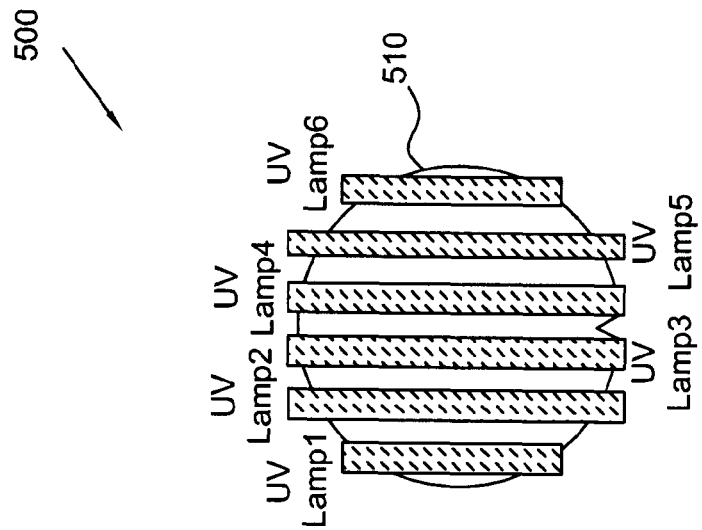
FIG. 5 is an illustration of exemplary ultraviolet lamps providing radiation to a wafer, according to one embodiment.

Some embodiments may include ultraviolet lamps that are presently available from manufacturers, such as Ushio™ of Japan and Fusion™ of the United States. Some embodiments include a variety of different types of bulbs to achieve the broadband energy. FIG. 5 is an illustration of a system 500 that includes multiple ultraviolet lamps irradiating wafer 510.

System 500 includes six ultraviolet lamps, labeled lamp 1-lamp 6. The lamps are positioned to expose wafer 510 to ultraviolet radiation. FIG. 5 illustrates a possible arrangement of wafer 510 with respect to lamps 1-6 in an example ultraviolet/ozone chamber that may be a stand-alone tool or may be integrated into another tool.

In a first example, lamps 2 and 5 are UV-A ultraviolet, and the other lamps are UV-C ultraviolet. UV-A ultraviolet has a wavelength in a range form about 320 to about 400 nm. UV-C ultraviolet has a wavelength in a range form about 200 to about 280 nm. Each of the lamps provides about 80 W-90 W and is positioned about thirty inches from wafer 510. The O3 is from an O3 generator and is twenty to forty percent O3 gas at 1000 sccm. Temperature is room temperature.

In a second example, lamps 2 and 5 produce ultraviolet C radiation, and the rest of the lamps produce ultraviolet B and A. UV-B ultraviolet has a wavelength in a range form about 280 to about 320 nm. Each of the lamps produces about 90 W-110 W and is positioned about thirty inches from wafer 510. The gas is fifteen to twenty-five percent O3 gas at 1000 sccm (produced from an O3 generator). The substrate temperature is about 120 C-170 C.

In some embodiments, a broadband ultraviolet is used. The broadband ultraviolet may include a plurality of different ultraviolet emissions across a spectrum from 200 nm to 1600 nm. One specific example includes at least one ultraviolet emission in the range of 200 nm to 280 nm, at least one emission in the range of 280 nm to 320 nm, and at least one emission in the range of 320 nm to 1600 nm. The use of a broadband ultraviolet may provide some amount of flexibility to the process, allowing the process to remove any of a variety of different photomasks that might not all be removable using only a narrowband ultraviolet emission.

The ultraviolet/ozone treatment may be performed for any appropriate time. In most instances, an appropriate time may depend on such factors as type of photoresist, type of residue, and whether the ultraviolet/ozone treatment is performed before or after a plasma ashing process.

While FIG. 5 shows six lamps for use in producing broadband ultraviolet radiation, the scope of embodiments is not so limited. Various embodiments may use any appropriate number of lamps to produce a desired broadband spectrum of ultraviolet radiation.

Figure 6:
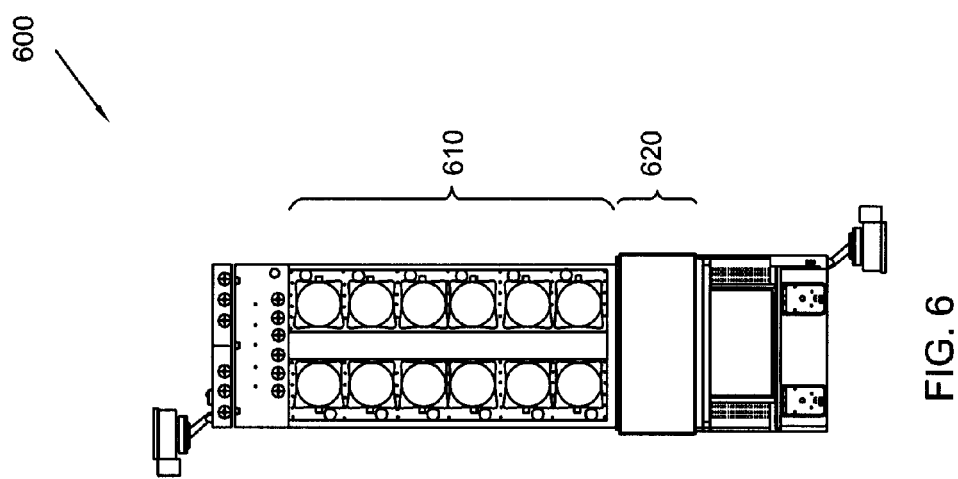
FIGS. 6 and 7 are illustrations of exemplary fabrication tools, according to one embodiment.

FIG. 6 is an illustration of exemplary fabrication tool 600, adapted according to one embodiment. Fabrication tool 600 includes two main portions: Ultraviolet/ozone chamber 620 and cleaning chamber 610.

In an example operation scenario, one or more wafers, such as wafer 510 of FIG. 5, enter chamber 620 for Ultraviolet/ozone treatment the same as or similar to that discussed above with respect to FIGS. 1-3 and 5. After the Ultraviolet/ozone treatment is finished, the wafers are removed from chamber 620 and transferred to chamber 610. In this example, chambers 610 and 620 are completely integrated into a single tool 600 so that the wafers do not leave tool 600 when moving from chamber 620 to chamber 610.

When the wafers are in chamber 610, they are subjected to a wet cleaning, such as that described above. Examples of wet cleaning include a high-temperature sulfuric peroxide mixture, though any other appropriate wet cleaning process is within the scope of embodiments. After wet cleaning, the wafers may be moved to a different tool (not shown) for further processing steps. Further, although not shown in FIG. 6, the wafers may be received by tool 600 from another tool, such as a plasma ashing tool. In some embodiments, wafers are moved between tools entirely automatically and by machine, whereas in other embodiments, wafers may be moved from tool to tool with human intervention.

Figure 7:
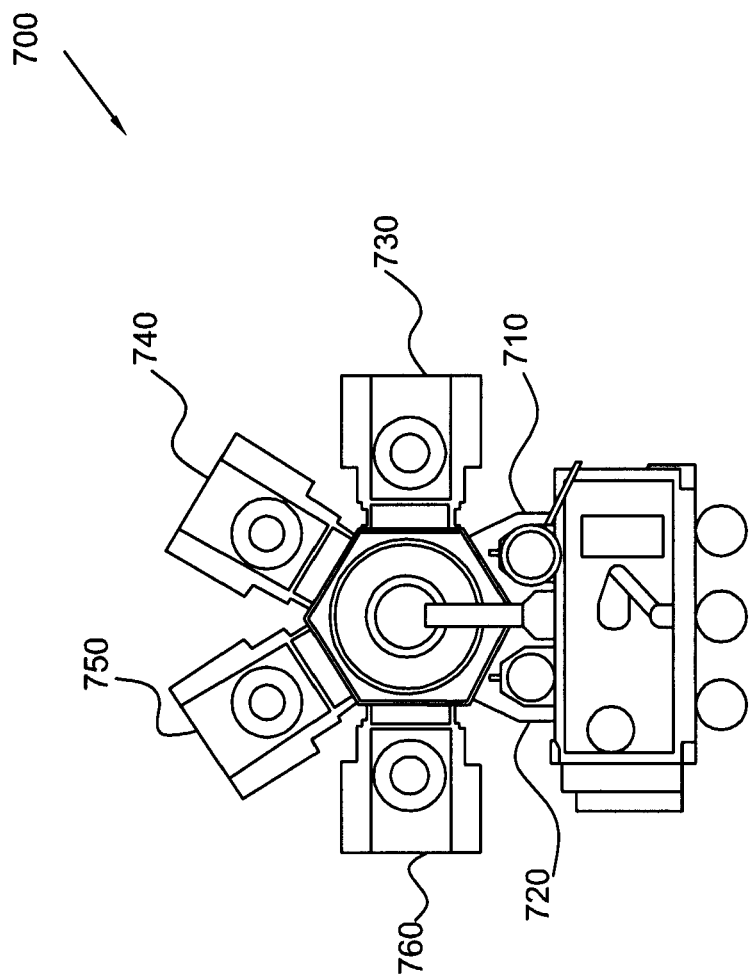

FIG. 7 is an illustration of exemplary fabrication tool 700, adapted according to one embodiment. Fabrication tool 700 includes Ultraviolet/ozone chambers 710, 720 and plasma ashing chambers 730-760. Ultraviolet/ozone chambers 710, 720 are integrated into tool 700 with plasma ashing chambers 730-760, and wafers may be moved between the two types of chambers within tool 700.

In one embodiment, the Ultraviolet/ozone treatment is applied to wafers after the plasma ashing process is performed. However, other embodiments may include performing Ultraviolet/ozone treatment before plasma ashing alternatively to, or in addition to, performing Ultraviolet/ozone treatment after plasma ashing. Tool 700 provides the option of performing ultraviolet/ozone treatment before and/or after plasma ashing.

Wafers may be transferred to other tools (not shown) after processing by tool 700. For instance, wafers may be transferred to a wet cleaning tool or other tool. Further, tool 700 may receive wafers from another tool (not shown), such as a tool performing source/drain implantation or other process. Just as with tool 600 of FIG. 6, wafers may be transferred between tools automatically or with human intervention.

Figure 8:
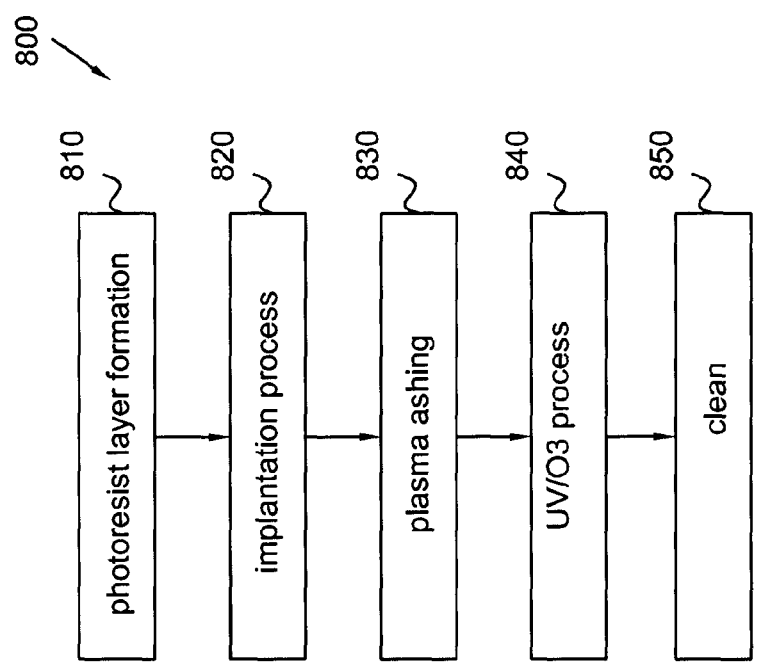
FIG. 8 is an illustration of an exemplary method that includes depositing and removing photoresist material, according to one embodiment.

FIG. 8 is an illustration of exemplary method 800 adapted according to one embodiment for manufacturing a semiconductor device. Exemplary method 800 may be performed by one or more fabrication tools at one or more fabrication facilities.

At block 810, a photoresist layer is formed and patterned according to known methods. The photoresist layer is formed on a semiconductor substrate that may include any kind of substrate now known or later developed, such as silicon, GaAs, and the like. The photoresist layer may be patterned in a manner that exposes some areas of the substrate to be implanted with dopants.

At block 820, an implantation process is performed, e.g., to form sources/drains or other features for a semiconductor device. The implantation process may further include an annealing step after the dopant impurities are applied in order to activate the dopant impurities.

At block 830, a plasma ashing process is performed. The plasma ashing may include, e.g., oxygen, and it removes some of the photoresist layer but may leave an ash residue on the substrate. An oxygen etch is only one type of reactive species in the plasma ashing, and various embodiments may use other types of plasma ashing, such as fluorine.

At block 840, the substrate is subjected to ultraviolet radiation and ozone. The ultraviolet radiation and ozone break down carbon chains in the photoresist and residue. The ultraviolet radiation and ozone treatment is described in more detail with respect to FIGS. 1-3 and 5.

At block 850, a wet clean is performed. The wet clean may include, e.g., a sulfuric acid and peroxide mixture applied at high temperature, though any appropriate cleaning process may be applied in other embodiments.

The scope of embodiments is not limited to the exact actions shown in method 100. On the contrary, other embodiments may add, omit, rearrange, or modify one or more actions. For instance, some embodiments may include another ultraviolet and ozone treatment before the plasma ashing at block 830. Furthermore, other embodiments may use the ultraviolet radiation and ozone treatment of block 830 to remove photoresist that has not been exposed to an implantation processes. In other words, some embodiments may omit the actions of block 820 if desired.

In some examples, the actions of method 800 are performed as a wafer-level process, where the wafer may include multiple die areas. Each of the die areas may have numerous features made thereon facilitated by the use of photoresist. For a given wafer, multiple layers of photoresist may be applied and then removed using example embodiments discussed herein. In other words, as a single wafer makes its way through a fabrication facility, various embodiments described herein may be applied multiple times before the wafer is diced.

Various embodiments may include one or more advantages over other more conventional techniques. For instance, some embodiments provide a more thorough removal of photoresist and photoresist residue than do conventional systems that do not apply ultraviolet or O3 treatment.

Furthermore, various embodiments may provide a robust technique for different types of photoresists and wafers by using a broadband ultraviolet radiation. Such characteristic may allow a tool to be used for many different wafers and photoresist types without physical alteration of the tool. In such embodiments, gas concentration, temperature, and time for exposure may also be adjusted, thereby providing more flexibility. Additionally, some ultraviolet/ozone processes lend themselves well to being applied before an ash process, after an ash process, or both in order to provide a thorough removal of photoresist and photoresist residue.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for manufacturing a semiconductor device, the method comprising:
   forming a patterned photoresist layer over a substrate;
   performing a plasma ashing process to the patterned photoresist layer, thereby removing a portion of the patterned photoresist layer;
   after the plasma ashing process, exposing the patterned photoresist layer to broadband ultraviolet radiation and ozone, thereby removing other portions of the patterned photoresist layer; and
   performing a cleaning of the patterned photoresist layer after exposing the patterned photoresist layer to broadband ultraviolet radiation and ozone.

2. The method of claim 1 further comprising:
   before the plasma ashing, performing implantation to portions of the substrate, the implantation chemically changing an outer surface of the patterned photoresist layer.

3. The method of claim 2 in which the outer surface includes molecules with single carbon bonds and in which the ultraviolet radiation and ozone transform the single carbon bonds to double carbon bonds and break the double carbon bonds.

4. The method of claim 1 in which the cleaning includes a sulfuric acid and peroxide mixture.

5. The method of claim 1 in which depositing the patterned photoresist layer includes depositing hexamethyldisilazane (HMDS), further in which the ultraviolet radiation and ozone remove at least a portion of the HMDS.

6. The method of claim 1 in which broadband ultraviolet radiation comprises radiation with at least a shortest wavelength of greater than 200 nm and a longest wavelength of less than 1600 nm.

7. The method of claim 1 in which the plasma ashing creates a photoresist ash residue, and in which the broadband ultraviolet radiation and the ozone remove at least a portion of the photoresist ash residue.

8. A method of manufacturing a semiconductor device, the method comprising:
   forming a patterned photoresist layer on a semiconductor substrate;
   removing at least a portion of the patterned photoresist layer by plasma ashing, the plasma ashing creating a photoresist plasma residue on the substrate;
   after the plasma ashing, exposing the photoresist plasma residue to ultraviolet radiation and ozone; and
   performing a cleaning on the photoresist plasma residue after the exposing.

9. The method of claim 8 further comprising:
  exposing the photoresist to ultraviolet radiation and ozone before performing the plasma ashing.

10. The method of claim 8 in which the ultraviolet radiation comprises broadband ultraviolet radiation.

11. The method of claim 8 in which the photoresist plasma residue includes ashed photoresist material and hexamethyldisilazane (HDMS).

12. The method of claim 8 further comprising:
  before the plasma ashing, performing implantation to portions of the substrate, the implantation forming a chemically altered outer surface of the photoresist layer.

13. The method of claim 12 in which the outer layer includes molecules with single carbon bonds and in which the ultraviolet radiation and ozone transform the single carbon bonds to double carbon bonds and break the double carbon bonds.

14. The method of claim 8 in which the cleaning includes a liquid sulfuric acid and peroxide mixture.

* * * * *